United States Patent
Ryu et al.

(10) Patent No.: US 9,431,525 B2
(45) Date of Patent: Aug. 30, 2016

(54) IGBT WITH BIDIRECTIONAL CONDUCTION

(71) Applicant: Cree, Inc., Durham, NC (US)

(72) Inventors: Sei-Hyung Ryu, Cary, NC (US); Qingchun Zhang, Cary, NC (US)

(73) Assignee: Cree, Inc., Durham, NC (US)

( * ) Notice: Subject to any disclaimer, the term of this patent is extended or adjusted under 35 U.S.C. 154(b) by 0 days.

(21) Appl. No.: 14/303,105

(22) Filed: Jun. 12, 2014

(65) Prior Publication Data

US 2015/0364584 A1    Dec. 17, 2015

(51) Int. Cl.
*H01L 29/732* (2006.01)
*H01L 29/739* (2006.01)
*H01L 29/36* (2006.01)
*H01L 29/66* (2006.01)

(52) U.S. Cl.
CPC ........... *H01L 29/7395* (2013.01); *H01L 29/36* (2013.01); *H01L 29/66333* (2013.01)

(58) Field of Classification Search
CPC ...................... H01L 29/66333; H01L 29/7395
See application file for complete search history.

(56) References Cited

U.S. PATENT DOCUMENTS

| | | | |
|---|---|---|---|
| 5,141,889 A * | 8/1992 | Terry | H01L 29/0834 148/DIG. 126 |
| 5,171,696 A * | 12/1992 | Hagino | H01L 29/0834 257/139 |
| 5,182,626 A * | 1/1993 | Akiyama | H01L 21/263 257/142 |
| 5,702,961 A * | 12/1997 | Park | H01L 29/0834 148/DIG. 126 |
| 2005/0017290 A1* | 1/2005 | Takahashi et al. | 257/328 |
| 2006/0118818 A1* | 6/2006 | Shimoida | H01L 29/0834 257/183 |
| 2007/0080407 A1* | 4/2007 | Kono | H01L 29/0834 257/370 |
| 2007/0221953 A1* | 9/2007 | Sakamoto | 257/155 |
| 2010/0219446 A1* | 9/2010 | Chen | H01L 27/0705 257/139 |
| 2013/0092978 A1* | 4/2013 | Sugawara et al. | 257/139 |
| 2013/0341674 A1* | 12/2013 | Werber et al. | 257/140 |
| 2014/0015007 A1* | 1/2014 | Werber | H01L 29/0615 257/142 |
| 2014/0070265 A1* | 3/2014 | Korec | H01L 29/66333 257/139 |

* cited by examiner

*Primary Examiner* — Bryan Junge
(74) *Attorney, Agent, or Firm* — Anthony J. Josephson (57) ABSTRACT

An IGBT device includes a drift region, a collector contact, an injector region, a pair of junction implants, a gate contact, and an emitter contact. The injector region includes a first surface in contact with the collector contact, a second surface opposite the first surface and in contact with the drift region, and at least one bypass region running between the first surface and the second surface. Notably, the at least one bypass region has a charge carrier that is different from that of the injector region. The pair of junction implants is in the drift region along a surface of the drift region opposite the injector region. The gate contact and the emitter contact are on the surface of the drift region opposite the injector region.

10 Claims, 14 Drawing Sheets

IGBT WITH BIDIRECTIONAL CONDUCTION

FIELD OF THE DISCLOSURE

The present disclosure relates to insulated gate bipolar transistor (IGBT) devices, structures, and methods for manufacturing the same.

BACKGROUND

Figure 1:
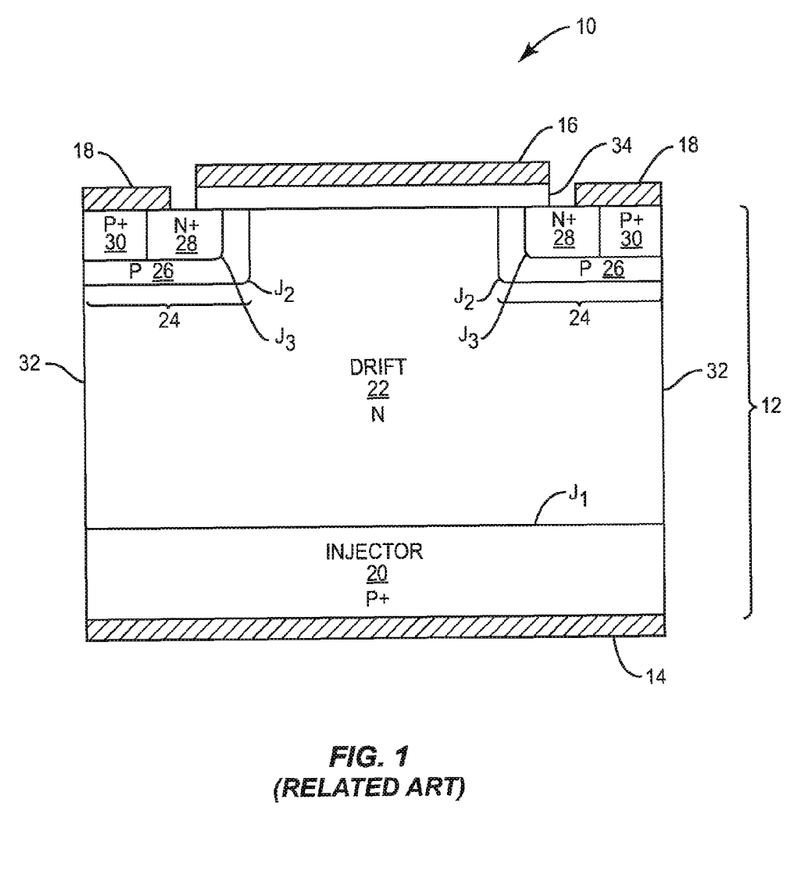
FIG. 1 shows a conventional insulated gate bipolar transistor (IGBT) device.

The insulated gate bipolar transistor (IGBT) is a semiconductor device that combines many of the desirable properties of a field-effect transistor (FET) with those of a bipolar junction transistor (BJT). An exemplary conventional IGBT device 10 is shown in FIG. 1. The conventional IGBT device shown in FIG. 1 represents a single IGBT cell that includes an IGBT stack 12, a collector contact 14, a gate contact 16, and an emitter contact 18. The IGBT stack 12 includes an injector region 20 adjacent to the collector contact 14, a drift region 22 over the injector region 20 and adjacent to the gate contact 16 and the emitter contact 18, and a pair of junction implants 24 in the drift region 22.

Each one of the junction implants 24 is generally formed by an ion implantation process, and includes a base well 26, a source well 28, and an ohmic well 30. Each base well 26 is implanted in the surface of the drift region 22 opposite the injector region 20, and extends down towards the injector region 20 along a lateral edge 32 of the IGBT stack 12. The source well 28 and the ohmic well 30 are formed in a shallow portion on the surface of the drift region 22 opposite the injector region 20, and are contained by the base well 26.

A gate oxide layer 34 is positioned on the surface of the drift region 22 opposite the injector region 20, and extends laterally between a portion of the surface of each one of the source wells 28, such that the gate oxide layer 34 partially overlaps and runs between the surface of each source well 28 in the junction implants 24. The gate contact 16 is positioned over the gate oxide layer 34. The emitter contact 18 includes two portions in contact with the surface of the drift region 22 opposite the injector region 20. Each portion of the emitter contact 18 on the surface of the drift region 22 opposite the injector region 20 partially overlaps both the source well 28 and the ohmic well 30 of one of the junction implants 24, respectively, without contacting the gate contact 16 or the gate oxide layer 34.

A first junction $J_1$ between the injector region 20 and the drift region 22, a second junction $J_2$ between each base well 26 and the drift region 22, and a third junction $J_3$ between each source well 28 and each base well 26 are controlled to operate in one of a forward-bias mode of operation or a reverse-bias mode of operation based on the biasing of the conventional IGBT device 10. Accordingly, the flow of current between the collector contact 14 and the emitter contact 18 is controlled.

The conventional IGBT device 10 has three primary modes of operation. When a positive bias is applied to the gate contact 16 and the emitter contact 18, and a negative bias is applied to the collector contact 14, the conventional IGBT device 10 operates in a reverse blocking mode. In the reverse blocking mode of the conventional IGBT device 10, the first junction $J_1$ and the third junction $J_3$ are reverse-biased, while the second junction $J_2$ is forward biased. The reverse-biased junctions $J_1$ and $J_3$ prevent current from flowing from the collector contact 14 to the emitter contact 18. Accordingly, the drift region 22 supports the majority of the voltage across the collector contact 14 and the emitter contact 18.

When a negative bias is applied to the gate contact 16 and the emitter contact 18, and a positive bias is applied to the collector contact 14, the conventional IGBT device 10 operates in a forward blocking mode. In the forward blocking mode of the conventional IGBT device 10, the first junction $J_1$ and the third junction $J_3$ are forward biased, while the second junction $J_2$ is reverse-biased. The reverse-bias of the second junction $J_2$ generates a depletion region, which effectively pinches off the channel of the conventional IGBT device 10 and prevents current from flowing from the collector contact 14 to the emitter contact 18. Accordingly, the drift region 22 supports the majority of the voltage across the collector contact 14 and the emitter contact 18.

When a positive bias is applied to the gate contact 16 and the collector contact 14, and a negative bias is applied to the emitter contact 18, the conventional IGBT device 10 operates in a forward conduction mode of operation. Similar to the forward blocking mode of operation, in the forward conduction mode of operation of the conventional IGBT device 10, the first junction $J_1$ and the third junction $J_3$ are forward-biased, while the second junction $J_2$ is reverse-biased. However, in the forward conduction mode of operation, the positive bias applied to the gate contact 16 generates an inversion channel on the surface of the drift region 22 opposite the injector region, thereby creating a low-resistance path for electrons to flow from the emitter contact 18 through each one of the source wells 28 and each one of the base wells 26 into the drift region 22. As electrons flow into the drift region 22, the potential of the drift region 22 is decreased, thereby placing the first junction $J_1$ in a forward-bias mode of operation. When the first junction $J_1$ becomes forward-biased, holes are allowed to flow from the injector region 20 into the drift region 22. The holes effectively increase the doping concentration of the drift region 22, thereby increasing the conductivity thereof. Accordingly, electrons from the emitter contact 18 may flow more easily through the drift region 22 to the collector contact 14.

The IGBT stack 12 of the conventional IGBT device 10 is Silicon (Si), the advantages and shortcomings of which are well known. In an attempt to further increase the performance of IGBT devices, many have focused their efforts on using wide band-gap materials such as Silicon Carbide (SiC) for the IGBT stack 12. Although promising, conventional IGBT structures such as the one shown in FIG. 1 are generally unsuitable for use with wide band-gap materials such as SiC. Due to inherent limitations in SiC fabrication processes, the carrier mobility and/or carrier concentration in the injector region 20 in a SiC IGBT device may be significantly diminished. Specifically, the conductivity in the injector region 20 will be low in a SiC device due to difficulties in growing high quality P-type epitaxial layers with low defect density. Further, due to damage in the drift region 22 caused by the ion implantation of the junction implants 24, the lifetime of carriers in the area directly below each junction implant 24 is significantly diminished. The result of the aforementioned conditions in a SiC IGBT device is that holes from the injector region 20 do not adequately modulate the conductivity of the portion of the drift region 22 above a certain distance from the injector region 20. Accordingly, electrons from the emitter contact 18 are met with a high-resistance path in the upper portion of the drift region 22, thereby increasing the on resistance $R_{ON}$ of the conventional IGBT device 10 significantly, or cutting off current flow in the device altogether.

In addition to the shortcomings discussed above, the conventional IGBT device 10 is only capable of uni-directional conduction, from the emitter contact 18 to the collector contact 14. Specifically, the first junction $J_1$ in the conventional IGBT device 10 generally prevents current from flowing from the collector contact 14 to the emitter contact 18. Accordingly, the conventional IGBT device 10 is not suitable for switching applications requiring reverse conduction capability. In order to use the conventional IGBT device 10 in applications requiring reverse conduction capability, an external anti-parallel diode must be placed between the collector contact 14 and the emitter contact 18. Integrating the conventional IGBT device 10 with an external anti-parallel diode in this manner allows the conventional IGBT device 10 to conduct in both directions. Although generally effective, the external anti-parallel diode adds cost and area to the resulting bi-directional conducting device.

Accordingly, an IGBT device is needed that is capable of taking advantage of the performance improvements inherent to wide band-gap semiconductor materials, while simultaneously being capable of bi-directional conduction.

SUMMARY

The present disclosure relates to insulated gate bipolar transistor (IGBT) devices and structures. According to one embodiment, an IGBT device includes a drift region, a collector contact, an injector region, a pair of junction implants, a gate contact, and an emitter contact. The injector region includes a first surface in contact with the collector contact, a second surface opposite the first surface and in contact with the drift region, and at least one bypass region running between the first surface and the second surface. Notably, the at least one bypass region has a charge carrier that is different from that of the injector region. The pair of junction implants is in the drift region along a surface of the drift region opposite the injector region. The gate contact and the emitter contact are on the surface of the drift region opposite the injector region. Including the at least one bypass region in the injector region allows current to effectively bypass the junction formed between the injector region and the drift region, thereby allowing bi-directional conduction in the IGBT device.

According to one embodiment, the drift region is separated into an upper drift region and a lower drift region by a charge storage layer, which extends between each lateral edge of the IGBT device. The charge storage layer effectively sources majority carriers to the drift layer of the IGBT device, thereby lowering the ON-state resistance of the IGBT device. Including the charge storage region allows a wide band-gap semiconductor material, such as silicon carbide (SiC) to be used for the IGBT device, thereby allowing the IGBT device to take advantage of many performance enhancements associated with the use thereof.

According to one embodiment, a method for manufacturing an IGBT device includes providing a drift region, a collector contact, an injector region, a pair of junction implants, a gate contact, and an emitter contact. The injector region includes a first surface in contact with the collector contact, a second surface opposite the first surface and in contact with the drift region, and at least one bypass region running between the first surface and the second surface. Notably, the at least one bypass region has a charge carrier that is different from that of the injector region. The pair of junction implants is provided in the drift region along a surface of the drift region opposite the injector region. The gate contact and the emitter contact are provided on the surface of the drift region opposite the injector region. Including the at least one bypass region in the injector region allows current to effectively bypass the junction formed between the injector region and the drift region, thereby allowing bi-directional conduction in the IGBT device.

According to one embodiment, a charge storage layer is also provided, which extends between each lateral edge of the IGBT device and separates the drift region into an upper drift region and a lower drift region. The charge storage layer effectively sources majority carriers to the drift layer of the IGBT device, thereby lowering the ON-state resistance of the IGBT device. Including the charge storage region allows a wide band-gap semiconductor material, such as silicon carbide (SiC) to be used for the IGBT device, thereby allowing the IGBT device to take advantage of the many performance enhancements associated with the use thereof.

BRIEF DESCRIPTION OF THE DRAWING FIGURES

The accompanying drawing figures incorporated in and forming a part of this specification illustrate several aspects of the disclosure, and together with the description serve to explain the principles of the disclosure.

DETAILED DESCRIPTION

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present disclosure. As used herein, the term "and/or" includes any and all combinations of one or more of the associated listed items.

It will be understood that when an element such as a layer, region, or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. Likewise, it will be understood that when an element such as a layer, region, or substrate is referred to as being "over" or extending "over" another element, it can be directly over or extend directly over the other element or intervening elements may also be present. In contrast, when an element is referred to as being "directly over" or extending "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "vertical" may be used herein to describe a relationship of one element, layer, or region to another element, layer, or region as illustrated in the Figures. It will be understood that these terms and those discussed above are intended to encompass different orientations of the device in addition to the orientation depicted in the Figures.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises," "comprising," "includes," and/or "including" when used herein specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms used herein should be interpreted as having a meaning that is consistent with their meaning in the context of this specification and the relevant art and will not be interpreted in an idealized or overly formal sense unless expressly so defined herein.

Figure 2:
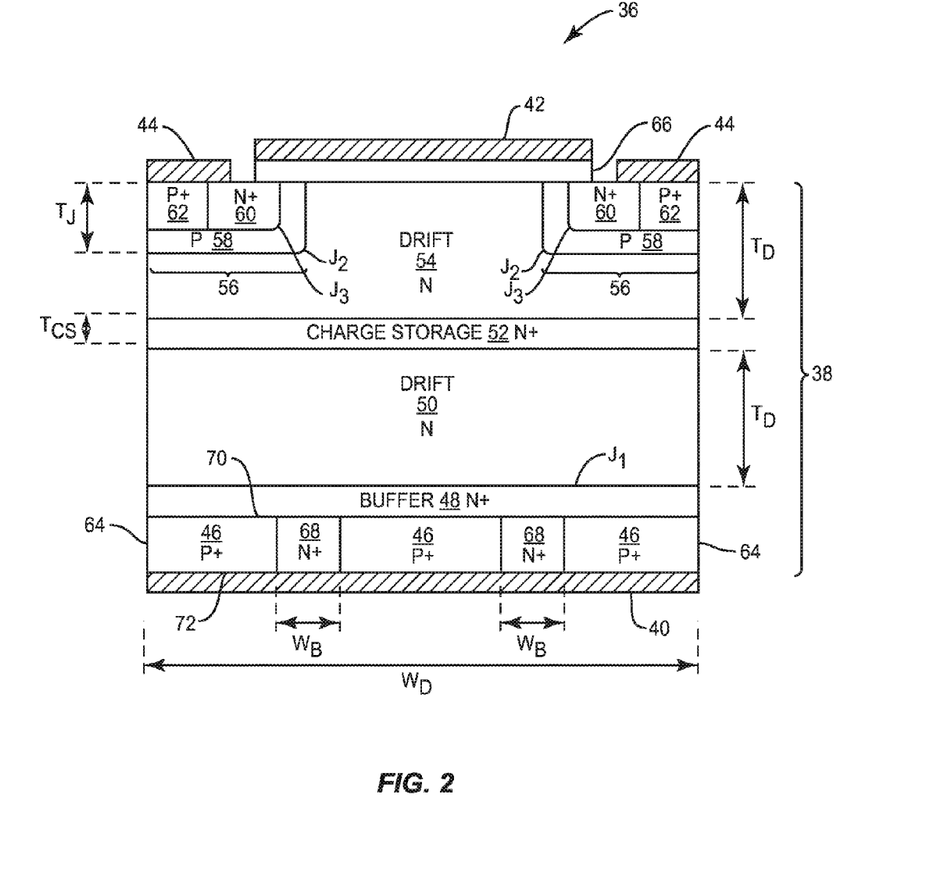
FIG. 2 shows an IGBT device capable of bi-directional conduction according to one embodiment of the present disclosure.
Figure 3:
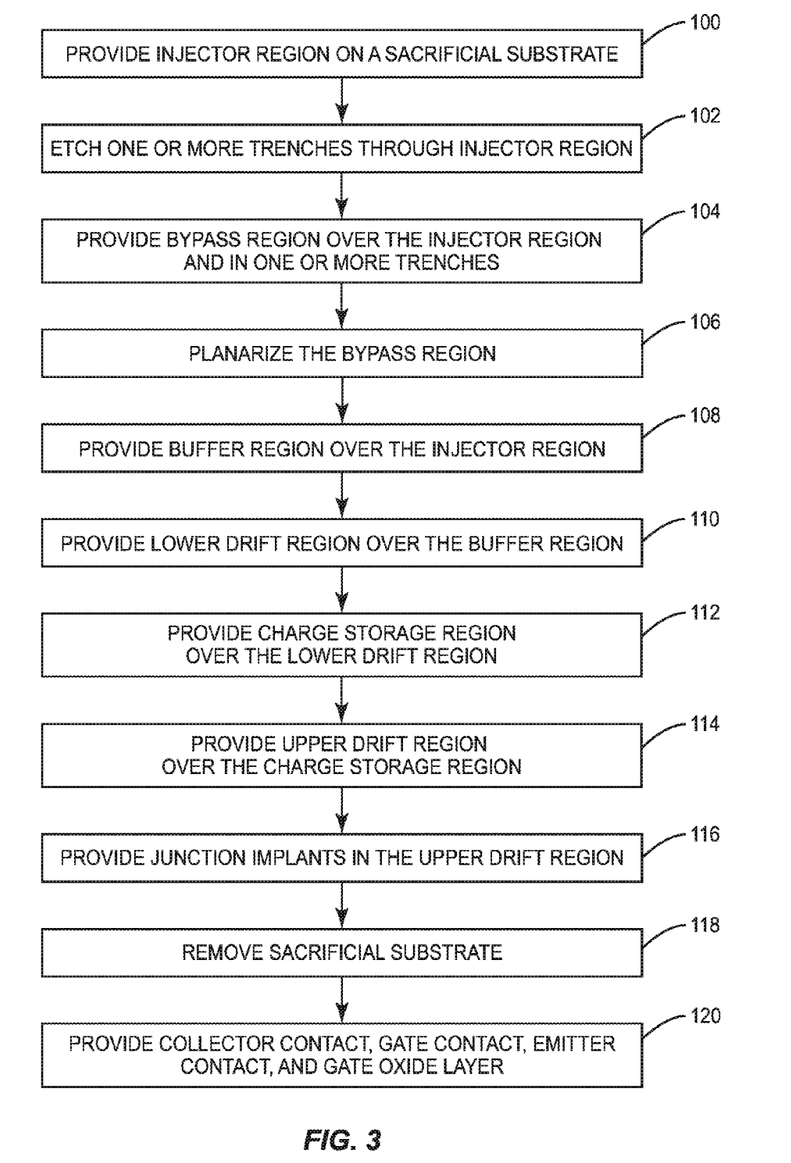
FIG. 3 shows a flow-chart illustrating a method for manufacturing the IGBT device shown in FIG. 2 according to one embodiment of the present disclosure.

Turning now to FIG. 2, an insulated gate bipolar transistor (IGBT) device 36 is shown according to one embodiment of the present disclosure. The IGBT device 36 includes an IGBT stack 38, a collector contact 40, a gate contact 42, and an emitter contact 44. The IGBT stack 38 includes an injector region 46 adjacent to the collector contact 40, a buffer region 48 over the injector region 46 opposite the collector contact 40, a lower drift region 50 over the buffer region 48 opposite the injector region 46, a charge storage region 52 over the lower drift region 50 opposite the buffer region 48, an upper drift region 54 over the charge storage region 52 opposite the lower drift region 50 and adjacent to the gate contact 42 and the emitter contact 44, and a pair of junction implants 56 in the upper drift region 54. In some embodiments, a junction field-effect transistor (JFET) region (not shown) may be also provided between the junction implants 56.

Each one of the junction implants 56 is generally formed by an ion implantation process, and includes a base well 58, a source well 60, and an ohmic well 62. Each base well 58 is implanted in the upper drift region 54 along a surface of the upper drift region 54 opposite the charge storage region 52, and extends down towards the charge storage region 52 along a lateral edge 64 of the IGBT stack 38. The source well 60 and the ohmic well 62 are formed in a shallow portion of the upper drift region 54 along the surface of the upper drift region 54 opposite the charge storage region 52, and are contained by the base well 58.

A gate oxide layer 66 is positioned on top of the surface of the upper drift region 54 opposite the charge storage region 52, and extends laterally between a portion of the surface of each one of the source wells 60, such that the gate oxide layer 66 partially overlaps and runs between the surface of each source well 60 in the junction implants 56. The gate contact 42 is positioned over the gate oxide layer 66. The emitter contact 44 includes two portions in contact with the surface of the upper drift region 54 opposite the charge storage region 52. Each portion of the emitter contact 44 on the surface of the upper drift region 54 opposite the charge storage region 52 partially overlaps both the source well 60 and the ohmic well 62 of one of the junction implants 56, respectively, without contacting the gate contact 42 or the gate oxide layer 66.

A first junction $J_1$ between the injector region 46 and the lower drift region 50, a second junction $J_2$ between each base well 58 and the upper drift region 54, and a third junction $J_3$ between each source well 60 and each base well 58 are controlled to operate in one of a forward-bias mode of operation or a reverse-bias mode of operation based on the biasing of the IGBT device 36. Accordingly, the flow of current between the collector contact 40 and the emitter contact 44 is controlled.

As discussed above, in a conventional IGBT device, the first junction $J_1$ between the injector region and the drift region prevents current from flowing from the collector contact to the emitter contact of the device. Accordingly, conventional IGBT devices require an external anti-parallel diode to form a bi-directional conducting device, which adds cost and area to the resulting device. Accordingly, the injector region 46 of the IGBT device 36 includes at least one bypass region 68, which runs between a first surface 70 and a second surface 72 of the injector region 46. In the exemplary embodiment shown in FIG. 2, the injector region 46 includes two bypass regions 68 running between the first surface 70 and the second surface 72 of the injector region 46, however, any number of bypass regions 68 may be included in the injector region 46 and arranged in any configuration without departing from the principles of the present disclosure. Each one of the bypass regions 68 may be contained by the injector region 46, such that each one of the bypass regions 68 is sandwiched between a portion of the injector region 46. Further, each one of the bypass regions 68 has a charge carrier that is different than that of the injector region 46 (and thus the same as the charge carrier of the buffer region 48 and the lower drift region 50). In the exemplary embodiment shown in FIG. 2, the injector region 46 is a P-type region, while each one of the bypass regions 68 are N-type regions. In an N-type IGBT device, the charge carriers of each one of the injector region 46 and the bypass regions 68 may be reversed. The bypass regions 68 effectively create a path for current around the first junction $J_1$, thereby allowing current to flow from the collector contact 40 to the emitter contact 44. Accordingly, the IGBT device 36 is capable of bi-directional conduction.

Although effective for enabling bi-directional conducting in the IGBT device 36, providing the bypass regions 68 in the injector region 46 also reduces the area of the injector region 46, thereby resulting in a decrease in minority carrier injection and thus conductivity modulation in the IGBT device 36. Decreasing the amount of backside minority carrier injection in the IGBT device 36 will effectively decrease the switching time of the device, thereby improving the performance of the IGBT device 36. However, such a decrease in minority carrier injection may come at the expense of an increased ON-state resistance of the IGBT device 36. The charge storage region 52 is thus provided in order to increase the concentration of majority carriers in the drift regions 50, 54 of the IGBT device 36 in an attempt to decrease the ON-resistance thereof. The charge storage region 52 may be a heavily doped region with the same charge carrier as the lower drift region 50 and the upper drift region 54. Further, the charge storage region 52 may separate the lower drift region 50 from the upper drift region 54, such that the area of the lower drift region 50 and the area of the upper drift region 54 are about equal. That is, the charge storage region 52 may be provided around the center of the overall drift region formed by the lower drift region 50 and the upper drift region 54. The charge storage region 52 may act as a source of majority carriers in the lower drift region 50 and the upper drift region 54, which effectively increases the concentration of minority carriers around the charge storage region 52 and thereby lowers the ON-state resistance of the IGBT device 36.

By utilizing the bypass regions 68 along with the charge storage region 52, the IGBT device 36 may be capable of bi-directional conduction while simultaneously maintaining a desirably low ON-state resistance. Providing the charge storage region 52 may decrease the blocking capability of the IGBT device 36. Accordingly, a designer may choose a doping concentration and thickness of the charge storage region 52 to provide an optimal trade-off between the ON-state resistance and the blocking capability of the IGBT device 36.

In one embodiment, the injector region 46 is a highly doped P-type region with a doping concentration between $1E16$ $cm^{-3}$ to $1E21$ $cm^{-3}$. The bypass regions 68 in the injector region 46 may be heavily doped N-type regions with a doping concentration between $1E18$ $cm^{-3}$ and $1E21$ $cm^{-3}$. The buffer region 48 may be a highly doped N-type region with a doping concentration between $5E15$ $cm^{-3}$ to $1E17$ $cm^{-3}$. The lower drift region 50 and the upper drift region 54 may be lightly doped N-type regions with a doping concentration between $1E13$ $cm^{-3}$ to $1E15$ $cm^{-3}$. The upper drift region 54, the lower drift region 50, or both, may have a graduated doping concentration, such that the doping concentration of the respective drift regions decreases as the distance from the gate contact 42 and the emitter contacts 44 increases. The charge storage region 52 may be a heavily doped N-type region with a doping concentration that is between 3-5 times that of the lower drift region 50 and the upper drift region 54. The base well 58 may be a P-type region with a doping concentration between $5E17$ $cm^{-3}$ and $1E19$ $cm^{-3}$, the source well 60 may be a highly doped N-type region with a doping concentration between $1E19$ $cm^{-3}$ and $1E21$ $cm^{-3}$, and the ohmic well 62 may be a heavily doped P-type region with a doping concentration between $1E18$ $cm^{-3}$ and $1E21$ $cm^{-3}$.

The injector region 46 may be doped with aluminum, boron, or the like. Many different dopants suitable for doping the injector region 46 exist, all of which are contemplated herein. The buffer region 48, the lower drift region 50, the charge storage region 52, and the upper drift region 54 may be doped with nitrogen, phosphorous, or the like. Many different dopants suitable for doping the buffer region 48, the lower drift region 50, the charge storage region 52, and the upper drift region 54 exist, all of which are contemplated herein.

According to one embodiment, the thickness $T_D$ of each one of the lower drift region 50 and the upper drift region 54 are about equal, and may be between 50 μm and 200 μm, depending on the voltage rating of the IGBT device 36. In other embodiments, the thickness $T_D$ of each one of the lower drift region 50 and the upper drift region 54 are different, such that the charge storage region 52 is not at or near the middle of the overall drift region formed by the lower drift region 50 and the upper drift region 54. The thickness $T_{CS}$ of the charge storage region 52 may be between 0.5 μm and 2 μm. The thickness $T_J$ of each one of the junction implants 56 may be less than that of the upper drift region 54, such that the junction implants 56 are contained by the upper drift region 54 and do not contact the charge storage region 52. In other embodiments, the junction implants 56 may be partially or completely contained by the charge storage region 52. The overall device width $W_D$ may be between about 4 μm and 20 μm. The width $W_B$ of each one of the bypass regions 68 may be between about 2 μm and 10 μm. In one embodiment, the ratio of the area of the bypass regions 68 to the area of the injector region 46 in the IGBT device 36 is below about 1:5.

According to one embodiment, the IGBT stack 38 is a wide band-gap semiconductor material. For example, the IGBT stack 38 may be silicon carbide (SiC), and therefore may enjoy the performance enhancements inherent therein. As discussed above, the IGBT device 36 shown in FIG. 2 is an N-type IGBT device. The principles of the present disclosure may be applied to P-type IGBT devices by switching the charge carrier of each one of the regions described herein.

FIGS. 3 and 4A-4K illustrate a process for manufacturing the IGBT device 36 shown in FIG. 2 according to one embodiment of the present disclosure. First, the injector region 46 is provided on a sacrificial substrate 74 (step 100 and FIG. 4A). The sacrificial substrate 74 may be required due to the unavailability of pre-manufactured P-type substrates in SiC. The sacrificial substrate 74 may be omitted in some circumstances, for example, if the IGBT device 36 being manufactured is a P-type IGBT device with an N-type injector region 46, in which case the injector region 46 may be used as the substrate for growing the additional regions of the device. In one embodiment, the injector region 46 is grown via an epitaxial growth process. Many different processes exist for providing the injector region 46, all of which are contemplated herein. The injector region 46 is then etched to generate one or more trenches 76 (step 102 and FIG. 4B), which run through the injector region 46 to the sacrificial substrate 74. According to one embodiment, a dry etching process is used to generate the trenches 76, in which a hard mask is placed over the injector region 46, and the hard mask is exposed to a bombardment of ions to anisotropically etch away the undesired portions of the injector region 46 and form the trenches 76. Many different suitable processes exit for generating the trenches 76 in the injector region 46, all of which are contemplated herein.

Figure 4A:
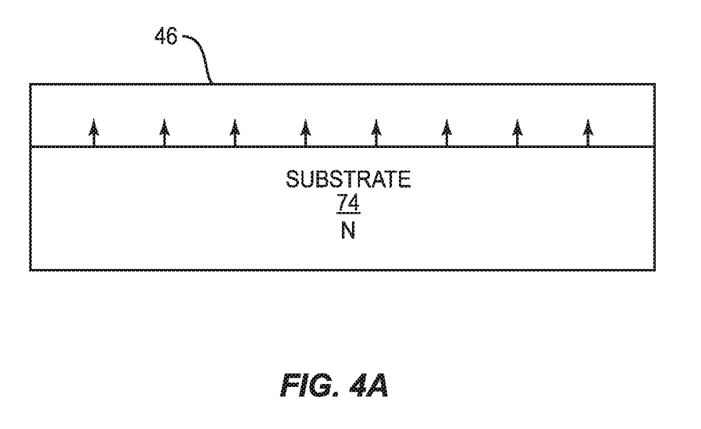
FIGS. 4A-4K illustrate the method for manufacturing the IGBT device described by the flow chart in FIG. 3.
Figure 4B:
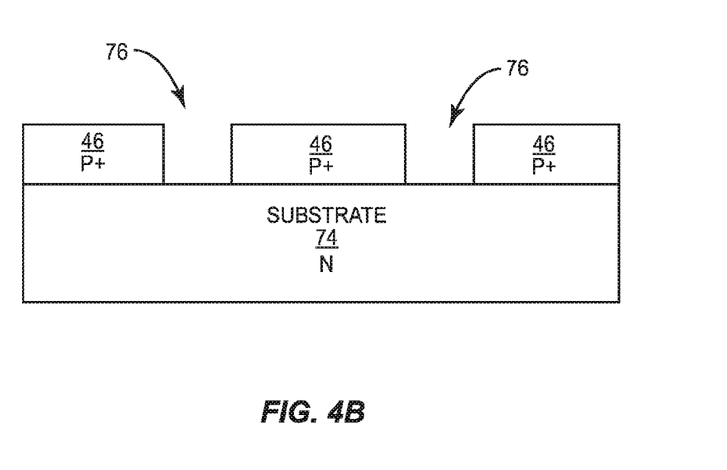
Figure 4C:
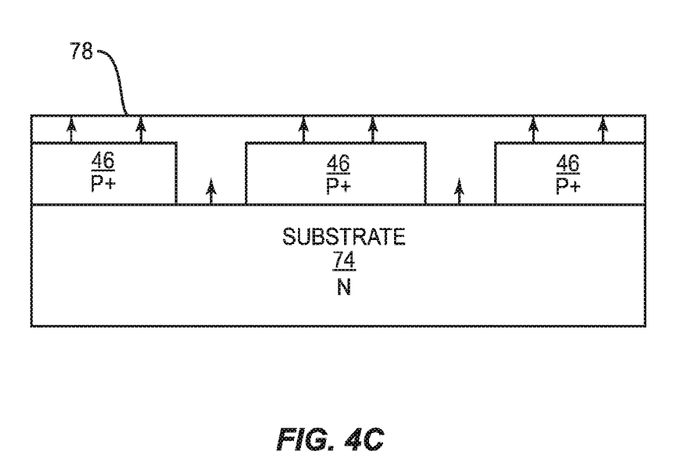
Figure 4D:
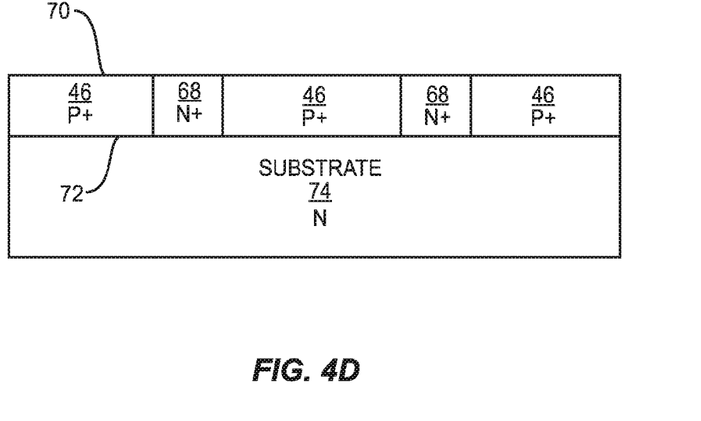

A bypass layer 78 is then provided on top of the injector region 46 and in the trenches 76 (step 104 and FIG. 4C). In one embodiment, the bypass layer 78 is grown by an epitaxial growth process. Many different processes for providing the bypass layer 78 exist, all of which are contemplated herein. Next, the surface of the bypass layer 78 is planarized (step 106 and FIG. 4D), leaving behind the injector region 46 including the one or more bypass regions 68 running between the first surface 70 and the second surface 72 of the injector region 46. In one embodiment, a chemical-mechanical planarization (CMP) technique is used to planarize the surface of the bypass layer 78. Many different processes for planarizing the surface of the bypass layer 78 exist, all of which are contemplated herein. In various embodiments, the planarized surface of the bypass layer 78 may be flat, or may contain one or more recesses around each one of the trenches 76 due to the growth pattern of the material within the trenches 76.

Figure 4E:
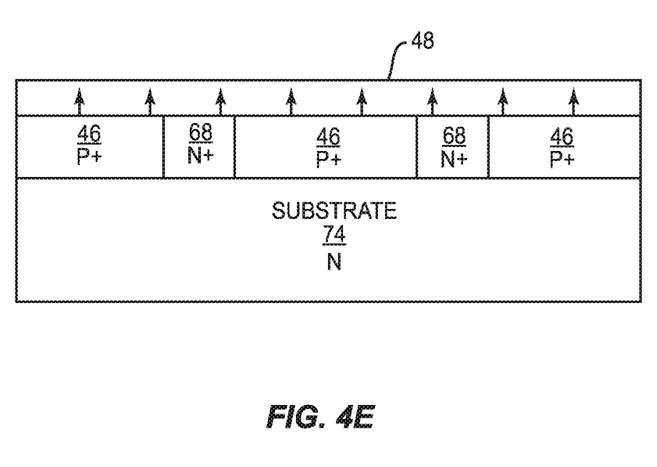
Figure 4F:
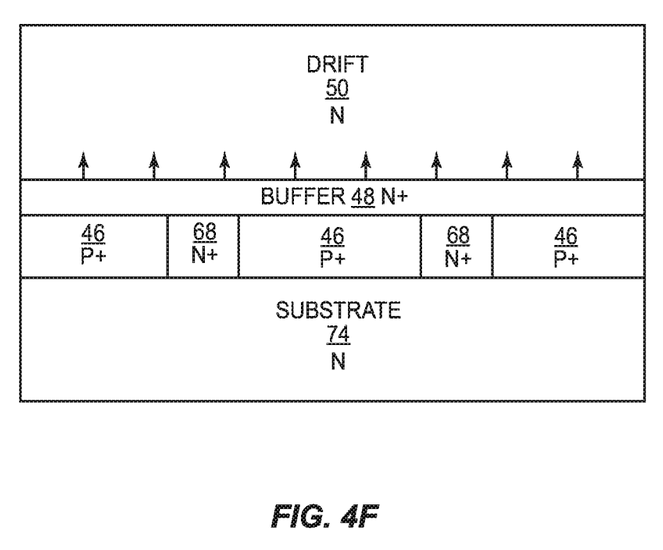
Figure 4G:
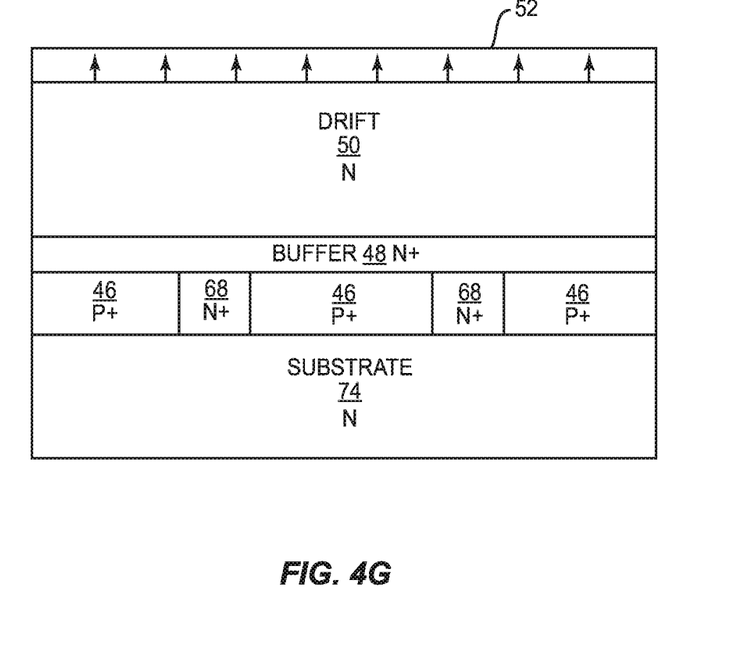
Figure 4H:
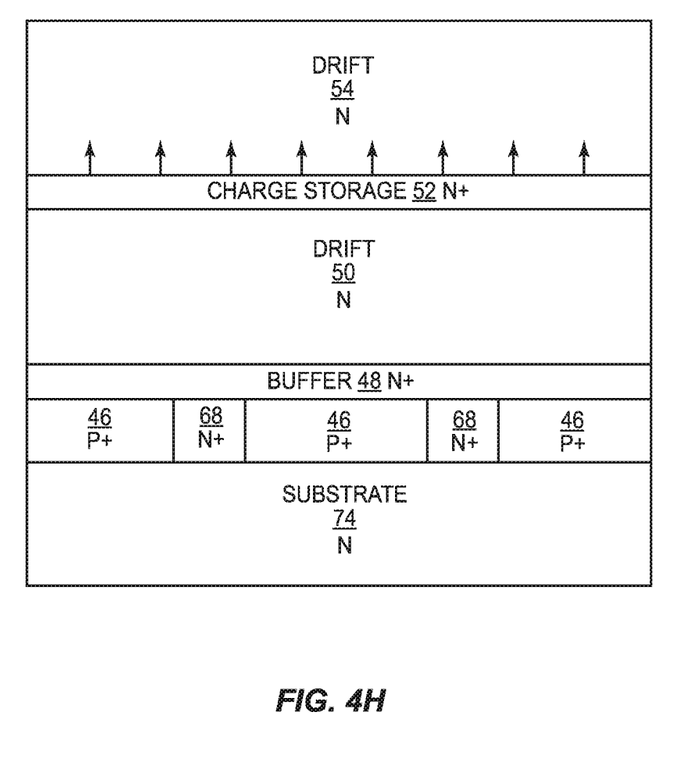

The buffer region 48 is then provided over the injector region 46 (step 108 and FIG. 4E), followed by the lower drift region 50 over the buffer region 48 (step 110 and FIG. 4F), the charge storage region 52 over the lower drift region 50 (step 112 and FIG. 4G), and the upper drift region 54 over the charge storage region 52 (step 114 and FIG. 4H). The buffer region 48, the lower drift region 50, the charge storage region 52, and the upper drift region 54 may be provided by an epitaxial growth process, such as CVD. Many different processes exist for providing the buffer region 48, the lower drift region 50, the charge storage region 52, and the upper drift region 54, all of which are contemplated herein.

Figure 4I:
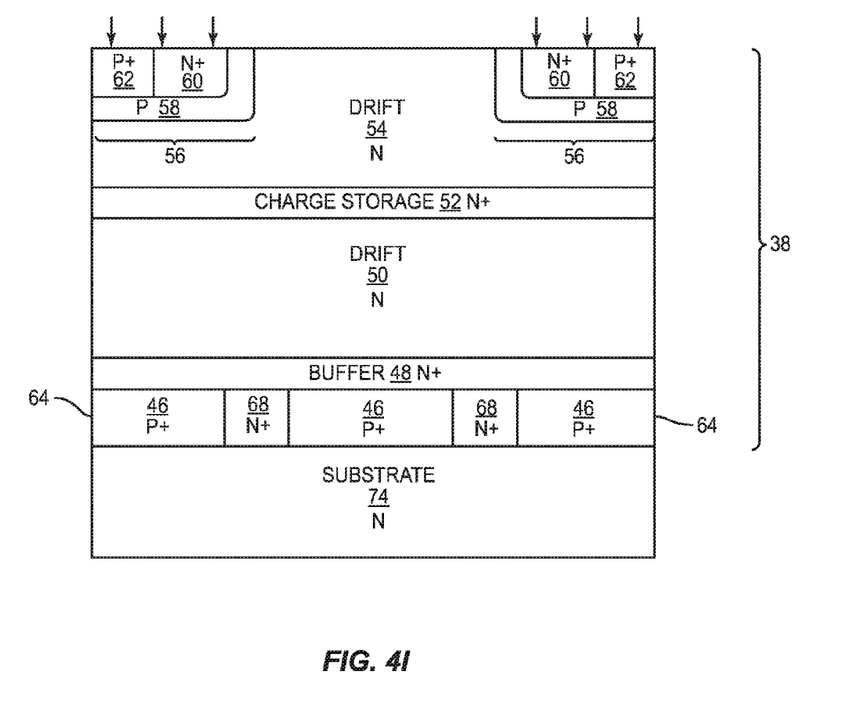
Figure 4J:
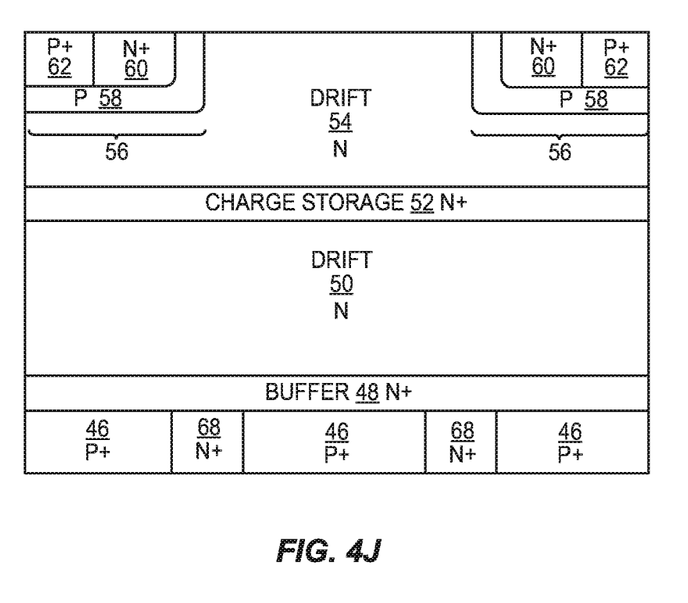
Figure 4K:
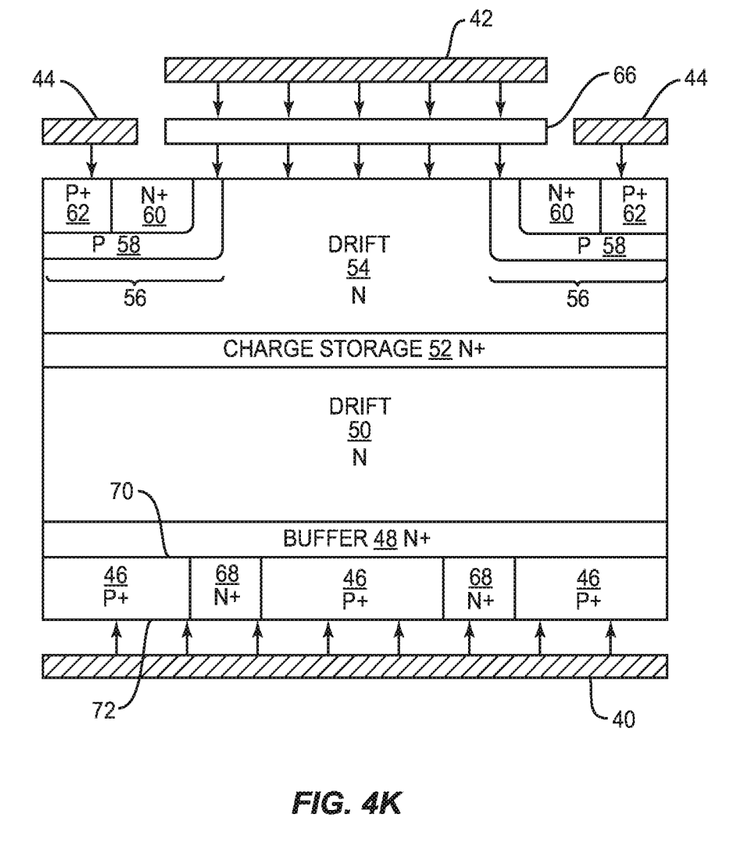

The junction implants 56 are then provided in the upper drift region 54 along a surface of the upper drift region 54 opposite the charge storage region 52 (step 116 and FIG. 4I), such that the junction implants 56 extend down towards the charge storage layer 52 along the lateral edge 64 of the IGBT stack 38. In one embodiment, the junction implants 56 are provided via an ion implantation process. Many different processes for providing the junction implants 56 exist, all of which are contemplated herein. Next, the sacrificial substrate 74 is removed (step 118 and FIG. 4J). In one embodiment, the sacrificial substrate is removed by a mechanical grinding or polishing process. Many different processes for removing the sacrificial substrate exist, all of which are contemplated herein. Finally, the collector contact 40, the gate contact 42, the emitter contact 44, and the gate oxide layer 66 are provided (step 120 and FIG. 4K). Specifically, the collector contact 40 is provided on the first surface 70 of the injector region 46, the emitter contact 44 and the gate oxide layer 66 are provided on the surface of the upper drift region 54 opposite the charge storage region 52, and the gate contact 42 is provided over the gate oxide layer 66. The collector contact 40, the gate contact 42, the emitter contact 44, and the gate oxide layer 66 may be provided by any suitable metallization or oxidation processes, respectively.

Those skilled in the art will recognize improvements and modifications to the preferred embodiments of the present disclosure. All such improvements and modifications are considered within the scope of the concepts disclosed herein and the claims that follow.

What is claimed is:

1. A method comprising:
   depositing an injector region on a substrate;
   separately depositing at least one bypass region through the injector region, wherein a charge carrier of the bypass region is different than that of the injector region;
   providing a drift region on the injector region opposite the substrate, the drift region comprising silicon carbide;
   providing a pair of junction barrier implants in the drift region opposite the injector region;
   providing a gate contact and an emitter contact on the drift region opposite the injector region.

2. The method of claim 1 wherein depositing the injector region and the at least one bypass region comprises:
   providing a blanket injector region having a first charge carrier;
   etching at least one trench through the blanket injector region; and
   providing the at least one bypass region in the at least one trench, wherein the charge carrier of the at least one bypass region is different from that of the blanket injector region.

3. The method of claim 1 wherein the ratio of the cross-sectional area of the at least one bypass region to the cross-sectional area of the injector region is less than about 1:5.

4. The method of claim 1 wherein each one of the pair of junction barrier implants are laterally separated from one another along the drift region opposite the substrate.

5. The method of claim 1 wherein:
   the injector region is a highly doped P region;
   the at least one bypass region is a highly doped N region; and
   the drift region is a lightly doped N region.

6. The method of claim 5 wherein:
   the injector region has a doping concentration in the range of about $1E16$ $cm^{-3}$ to about $1E21$ $cm^{-3}$;
   the at least one bypass region has a doping concentration in the range of about $1E18$ $cm^{-3}$ to about $1E21$ $cm^{-3}$; and
   the drift region has a doping concentration in the range of about $1E13$ $cm^{-3}$ to about $1E15$ $cm^{-3}$.

7. The method of claim 1 further comprising providing a charge storage region in the middle of the drift region between each lateral edge of the drift region, such that the charge storage region separates the drift region into an upper drift region and a lower drift region.

8. The method of claim 7 wherein:
   the injector region is a highly doped P-type region;
   the at least one bypass region is a highly doped N-type region;
   the drift region is a lightly doped N-type region; and
   the charge storage region is a highly doped N-type region.

9. The method of claim 8 wherein:
   the injector region has a doping concentration in the range of about $1E16$ $cm^{-3}$ to about $1E21$ $cm^{-3}$;
   the at least one bypass region has a doping concentration in the range of about $1E18$ $cm^{-3}$ to about $1E21$ $cm^{-3}$;
   the drift region has a doping concentration in the range of about $1E13$ $cm^{-3}$ to about $1E15$ $cm^{-3}$; and
   the charge storage region has a doping concentration from about $1E13$ $cm^{-3}$ to about $1E15$ $cm^{-3}$.

10. The method of claim 1 further comprising removing the substrate and providing a collector contact on the injector region opposite the drift region.

* * * * *